US007088904B2

(12) United States Patent
Ryan, Jr.

(10) Patent No.: US 7,088,904 B2
(45) Date of Patent: Aug. 8, 2006

(54) LIGHT EMITTING MODULE

(76) Inventor: Patrick Henry Ryan, Jr., 100 Cat Cay Ct., Atlanta, GA (US) 30350

( * ) Notice: Subject to any disclaimer, the term of this patent is extended or adjusted under 35 U.S.C. 154(b) by 0 days.

(21) Appl. No.: 11/304,518

(22) Filed: Dec. 14, 2005

(65) Prior Publication Data

US 2006/0093308 A1 May 4, 2006

Related U.S. Application Data

(62) Division of application No. 10/460,072, filed on Jun. 12, 2003, now Pat. No. 7,000,999.

(51) Int. Cl.
*H01L 29/06* (2006.01)
*F21V 29/00* (2006.01)

(52) U.S. Cl. ........................ 385/147; 362/218; 257/99

(58) Field of Classification Search ................ 362/218
See application file for complete search history.

(56) References Cited

U.S. PATENT DOCUMENTS

| | | | | |
|---|---|---|---|---|
| 4,949,156 | A | 8/1990 | Mii | |
| 6,158,882 | A | 12/2000 | Bischoff, Jr. | |
| 6,299,337 | B1 | 10/2001 | Bachl et al. | |
| 6,346,777 | B1 * | 2/2002 | Kim | 315/185 S |
| 6,371,637 | B1 | 4/2002 | Atchinson et al. | |
| 6,394,623 | B1 | 5/2002 | Tsui | |
| 6,541,800 | B1 | 4/2003 | Barnett et al. | |
| 6,566,824 | B1 * | 5/2003 | Panagotacos et al. | 315/291 |
| 6,619,831 | B1 | 9/2003 | Kanesaka | |
| 6,634,779 | B1 | 10/2003 | Reed | |
| 6,730,933 | B1 | 5/2004 | Shimizu et al. | |
| 6,882,111 | B1 * | 4/2005 | Kan et al. | 315/122 |
| 6,914,194 | B1 | 7/2005 | Fan | |
| 2002/0145392 | A1 | 10/2002 | Hair, III et al. | |
| 2003/0063463 | A1 * | 4/2003 | Sloan et al. | 362/238 |

* cited by examiner

*Primary Examiner*—John D. Lee
*Assistant Examiner*—Jerry T Rahll
(74) *Attorney, Agent, or Firm*—Jason A. Bernstein; Powell Goldstein LLP

(57) ABSTRACT

A light-emitting module structurally suspended between a pair of spaced apart electrical conducting wires wherein each of the wires has selected portions that are electrically insulated from the module. The light emitting module, in concert with the electrical conducting wires, provides structural support for the light emitter portion of the light emitting module via the connections to the insulated and non-insulated portions of the electrical conducting wires. A plurality of light emitting modules may be ganged together in series, parallel or series-parallel electrical configurations to produce chains of light emitting modules. The chains of light emitting modules produce selected or desired illumination depending on the quantity of light emitting modules being ganged together.

28 Claims, 4 Drawing Sheets

LIGHT EMITTING MODULE

PRIORITY CLAIM

The present application is a divisional of copending U.S. patent application Ser. No. 10/460,072, filed Jun. 12, 2003, now U.S. Pat. No. 7,000,999, the specification of which is herein incorporated by reference in its entirety.

FIELD OF THE INVENTION

The present invention relates, in general, to a light-emitting module. In particular, the present invention relates to a light-emitting module suspended between a pair of electrical conducting wires or electrically isolated conductors. More particularly, the invention relates to a plurality of light emitting modules ganged together to produce desired illumination.

BACKGROUND OF THE INVENTION

A light emitting diode (LED) is a type of semiconductor device that emits a visible light when biased in the forward direction. Lamps incorporating such LEDs as their light source are referred to as LED lamps. Due to their construction, LED lamps are typically smaller than standard neon type lamps, making their use particularly desirable in applications where a premium is placed on space, such as advertising signs and lighted building fascia. Additionally, the LED is energy efficient in that it only requires a small amount of electricity in order to generate a relatively strong light. Therefore, the LED is a particularly desirable lighting source in applications where energy efficiency is important, such as large outdoor advertising signs that typically consume large amounts of electrical energy.

Generally, LED lamps offer a relatively high degree of illumination for their size. LED lamps must usually be combined with other LED lamps in order to achieve the same degree of illumination as a light assembly illuminated by standard neon tubes. The combination of LED lamps typically occupies less space and requires less energy to operate than that of the standard neon type lamps they replace. The space saving and energy efficient features of the LED make it a popular choice with designers who are motivated to reduce the size and/or increase the efficiency of the light source used in their products.

Recently, LED lamps have found application in the signage industry as a source of illumination, replacing standard neon type lamps, for exterior lights, such as channel letters, lighted fascias and the like. It is highly desirable that the light source used in the signs be energy efficient. The LED is a popular choice in such an application because its use permits the replacement of standard neon type lamps that require a larger space and consume a greater amount of energy to operate.

The standard neon type lamps are known to have a high rate of failure when used in a sign application. The high failure rate is attributed to the glass tube breaking due to sudden shocks or bumps experienced under normal manufacturing or shipping conditions. Unlike standard neon type lamps, LED lamps are immune to such failures due to their inherent construction. The light emitted by an LED is caused by the generation of photons from materials within the LED and is not the product of an electric current passing through an illuminating gas. Since the LED does not rely on the glass tube scheme used in neon type lamps, it is better suited for use as a reliable lighting source.

Additionally, standard filament bulb type lamps are known to generate a large amount of heat during their operation. The heat generated by standard filament bulb type lamps not only shortens the life of the light source but may cause thermal damage, deformation, cracking or the like to other nearby lighting elements, such as the deformation or cracking of a nearby plastic lens.

LED modules comprising a plurality of LED lamps are known in the art. Such modules are generally made up of a plurality of LED lamps, each having an anode and cathode lead and a printed circuit board with conductive paths. The plurality of LED lamps are each connected to the printed circuit board by soldering the anode lead of each LED to one path and soldering the cathode lead of each LED to another path. The LED lamps may be arranged along the printed circuit board as desired in order to meet the illumination, space and configuration requirements of the particular light assembly. The LED module is mechanically attached to the light assembly and the printed circuit board is electrical connected to an anode or cathode electrical source within the light assembly.

LED modules known in the art have attempted to minimize the potential for thermal damage to the LED lamps by constructing the LED leads from materials having a low thermal conductivity, such as steel. Using materials of low thermal conductivity reduces the amount of heat that can be transferred from the solder site to the LED chip itself. However, materials having low thermal conductivity necessarily have a correspondingly low electrical conductivity. Therefore, the methods used in the art to minimize the thermal damage of the LED lamps during the soldering operation has resulted in the construction of a LED module that does not display optimal electrical efficiency. Additionally, LED leads constructed from such low thermal conductivity materials effectively limit the amount of power that the LED can dissipate and remain within reliable operational parameters.

Mounting LED lamps on a printed circuit board is also costly. Each LED must be individually positioned on the board for assembly. The boards themselves are costly. Accordingly, a different approach for connecting LED lamps is desirable for both reducing the cost of an LED module and increasing the electrical efficiency of an LED module.

It would be desirable to have an LED module that can accommodate a plurality of LED lamps in a manner that will optimize the reliability of each LED. It would be desirable that the mounting of LED lamps in the LED module promote optimal electrical and thermal efficiency. It would be further desirable that the LED module permit arbitrary spacing of each LED in order to correspond to predetermined shapes or illumination requirements. It would be also desirable that the LED module be practical to produce from both an economic and manufacturing standpoint.

SUMMARY OF THE INVENTION

The present invention is a light emitting module that may, if desired, be encased in a plurality of structurally different translucent materials that permit visible emitted light to be perceived by an observer. The present invention is not dependent on the encasement of the structural materials to emit light and may, if desired, operationally emit light without any surrounding encasement.

The light-emitting module may, if desired, be structurally suspended between a pair of spaced apart electrical conducting wires. Each of the electrical conducting wires has selected portions that are electrically insulated from its respective wire. The light emitting module, in concert with the electrical conducting wires, provides structural support for the light emitting portion of the light emitting module via the insulated and uninsulated portions of the electrical conducting wires.

The light-emitting module may, if desired, be formed from a pair of heat-sinks. Each heat-sink is bounded by a perimeter and each heat-sink has a portion of the perimeter edge facing a portion of the other heat-sink's perimeter edge. The first heat-sink has selected portions of its perimeter connectively suspended between the selected insulated portions of spaced apart electrical conducting wires. The first heat-sink has one end of a resistor electrically connected thereto and other end of the resistors is electrically connected to the first electrical conducting wire. The second heat-sink has selected portions of its perimeter connectively suspended between the selected insulated portions of the spaced apart electrical conducting wires. A selected portion along the perimeter edge of the second heat-sink is electrically connected to the second electrical conducting wire. A selected light emitter is juxtaposition the first heat-sink's facing edge and the second heat-sink's facing edge. The selected light emitter is electrically connected to the first heat-sink and the second heat-sink via any convenient means.

The first heat-sink may, if desired, be formed from a first substantially rectangular member adjacently spaced to a second heat-sink formed as a second substantially rectangular member. Each of the rectangular members has a facing edge. The first rectangular member has one of its short sides connected about the insulated portion of the first electrical conducting wire. The first rectangular member has a resistor with one end electrical connected to the first rectangular member and the other end electrical connected to the first electrical conducting wire. The second rectangular member has a selective portion of one long side connected about the second electrical conducting wire. The first and second rectangular members have the light emitter connectively suspended therebetween. The second rectangular member is of a selected geometrical shape and has a sufficient thermal gradient to conduct the thermal energy away from the light emitter.

If desired, the first rectangular member's other short side may be connected about the selected insulated portion of the second electrical conducting wire. A selected portion of the other long side of the second rectangular member may be connected about a selected insulated portion of the first electrical conducting wire. Further, to increase the structural integrity of the present invention to the electrical conducting wires a selected portion of the second rectangular member's long side may be connected about a selected insulated portion of the first electrical conducting wire.

The light-emitting module may, if desired, be structurally suspended between electrically isolated conductors. The light emitting module, in concert with the electrically isolated conductors, provides structural support for the light emitting portion of the light emitting module via the isolated conductors.

The light emitting module may, if desired, be formed from a plurality of electrically isolated conductors that exhibit heat-sinking characteristics, a plurality of light emitters and a selected resistor. The electrically isolated conductors may, if desired, be manufactured from a process that removes portions of a continuous conductor thereby electrically isolating selected portions of the conductor. The manufactured electrically isolating conductors are grouped into a first pair of electrically isolated conductors that have a first light emitter structurally suspended therebetween. A second pair of electrically isolated conductors has a second light emitter structurally suspended therebetween. A selected current limiting resistor is electrically connected between the first and second pair of electrically isolated conductors. The light emitting module's first and second light emitters are illuminated from power received via the first and the second pair of electrically isolated conductors.

The present invention may, if desired, incorporate a plurality of light emitting modules ganged together in series, parallel or series-parallel electrical configurations to produce chains of light emitting modules. The chains of light emitting modules produce selected or desired illumination depending on the quantity of light emitting modules being ganged together. Other features and advantages of the present invention will become apparent upon reading the following detailed description of embodiments of the invention, when taken in conjunction with the appended claims.

BRIEF DESCRIPTION OF THE DRAWINGS

The invention is illustrated in the drawings in which like reference characters designate the same or similar parts throughout the figures of which.

DETAILED DESCRIPTION OF THE PRESENT INVENTION

Figure 2:
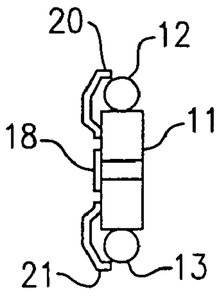
FIG. 2 illustrates an end view schematic diagram of the first exemplary embodiment of the present invention, FIG. 1.

Before describing in detail the particular improved light-emitting module in accordance with the present invention, it should be observed that the present invention resides primarily, though not exclusively, in a novel structural combination of conventional materials and discrete components associated with the aforementioned light-emitting module and not in the particular detailed configuration thereof. Accordingly, the structure and arrangement of these conventional components have, for the most part, been illustrated in the drawings by readily understandable diagram representations and schematic diagrams. The drawings show only those specific details that are pertinent to the present invention in order not to obscure the disclosure with structural details which will be readily apparent to those skilled in the art having the benefit of the description herein. For example, a light emitter 11, FIG. 2 may, if desired, be any convenient light emitter connected to the present invention 10. Various portions of the light emitter's 11 connections to the present invention 10 have been simplified in order to emphasize those portions that are most pertinent to the invention. Thus, the schematic diagram illustrations of the Figures do not necessarily represent the mechanical structural arrangement of the exemplary system, and are primarily intended to illustrate major hardware structural components of the present invention 10 in a convenient functional grouping whereby the present invention may be more readily understood.

Figure 1:
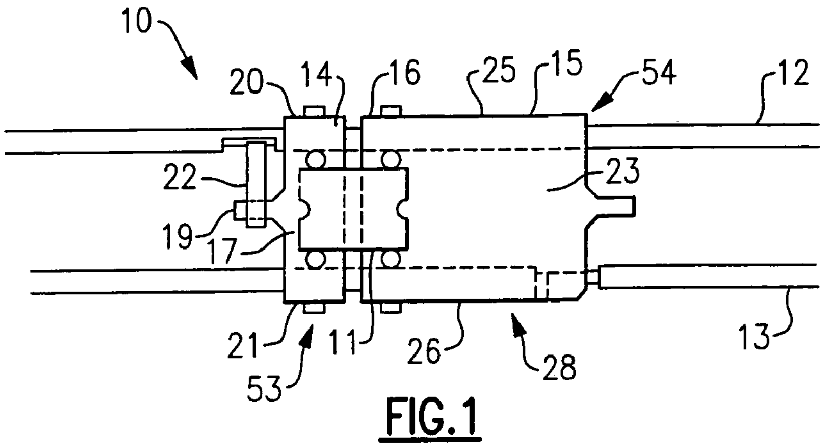
FIG. 1 illustrates a schematic diagram of a first exemplary embodiment of the present invention.

Overview of the present invention: FIG. 1 shows one exemplary embodiment 10 of the present invention in which a light-emitting module 28 is formed by a pair of heat-sinks 53 and 54. Each heat-sink 53 and 54 is bounded by a perimeter wherein the perimeter has selected portions thereof structurally suspended between a pair of spaced apart electrical conducting wires 12 and 13. Each of the electrical conducting wires 12 and 13 has selected portions that are electrical insulated from its respective electrical conducting wires. Thereby the electrical conducting wires 12 and 13 provide structural support for the light-emitting module 28 via the electrically insulated portions, structural support and electrical power via the uninsulated portions.

A plurality of light emitting modules 28 may, if desired, be ganged together in an electrical configuration in-series or in parallel to produce a high candlepower of light. For example, highway signage typically requires a plurality of light emitting modules 28 ganged together to sufficiently illuminate the highway sign.

A more detailed discussion of the present invention 10: The light emitting module 28, FIG. 1 may, if desired, be formed from a first substantially rectangular member 14. The first substantially rectangular member 14 has a top surface 17 and a bottom surface 18. The top surface 17 may, if desired, have imprinted or disposed thereon a connection substance that facilitates the attachment of the anode of the light emitter 11. For example, top surface 17 is tinned with solder and the anode of the light emitter 11 is positioned thereon. Heat is applied to the first substantially rectangular member 14 thereby re-flowing the solder and connecting the anode of the light emitter 11 to the first substantially rectangular member 14. The two short sides 20 and 21 are formed about the electrical insulated portion of the electrical conducting wires 12 and 13, respectively. In this particular instance, the electrical conducting wire 12 is designated as positive and the electrical conducting wire 13 is designated as negative. The two short sides 20 and 21 are formed about the electrical insulated portion of the electrical conducting wires 12 and 13 by rolling, crimping or press fitting.

The first substantially rectangular member 14, shown in FIG. 1, has along one long side an outwardly projecting substantially rectangular shaped tab 19. The tab 19 has one end of a selected resistor 22 electrically connected thereto. The other end of the resistor 22 is connected to the electrical conducting wire 12. The selection of the resistance value of the resistor 22 is dependent on the desired illuminated intensity of the present invention 10. For example, if maximum intensity is desired the resistive value of resistor 22 would be minimum. If minimum intensity is desired, the resistive value of resistor 22 would be maximized.

A second substantially rectangular member 15, shown in FIG. 1, is adjacently spaced to the first substantially rectangular member 14. The second substantially rectangular member 15 has one edge 16 facing one long side of the first substantially rectangular member. The second substantially rectangular member 15 has a top surface 23 and a bottom surface 24 (not shown). The top surface 23 may, if desired, have imprinted or disposed thereon by any convenient means a connection substance that facilitates the attachment of the cathode of the light emitter 11. For example, top surface 23 is tinned with solder and the cathode of the light emitter 11 is positioned thereon. Heat is applied to the first substantially rectangular member 14 thereby re-flowing the solder and connecting the cathode of the light emitter 11 to the second substantially rectangular member 15. The second substantially rectangular member's 15 first long side 25 is formed about the electrical insulated portion of the electrical conducting wire 12. The second substantially rectangular member's 15 second long side 26 has a selected portion thereof formed about the insulated electrical conducting wire 13 and a second selected portion of the second long side 26 is formed about the electrical conducting wire 13. The two long sides 25 and 26 are formed about the insulated portion of the electrical conducting wires 12 and 13 may, if desired, be roll formed, crimped or press fitted. The second portion of the second long side 26 formed about the electrical conducting wire 13 may, if desired, be electrically connected to the wire 13 by soldering, crimping, spot welding or alloying.

In operation, the aforementioned exemplary embodiment of the present invention 10 has a pair of electrical conducting wires 12 and 13 operationally disposed thereto. The electrical conducting wires 12 and 13 provide the light emitter 11 with electrical power to emit light. The light emitter 11, during operation experiences power losses. The power losses are ejected into the ambient atmosphere in the form of heat. If desired, the second substantially rectangular member's 15 physical size may be selected to dissipate the heat generated by the light emitter 11. The selection process entails selecting a size of second substantially rectangular member 15 such that its thermal gradient is sufficient to transfer the heat away of the light emitter 11. The second substantially rectangular member 15 may be fabricated from any convenient thermally conductive material such as copper, aluminum, gold or silver. For example, but not by way of limitation, a copper substrate measuring about ¾ inch×½ inch is sufficient to transfer the heat away of the light emitter 11.

Figure 3:
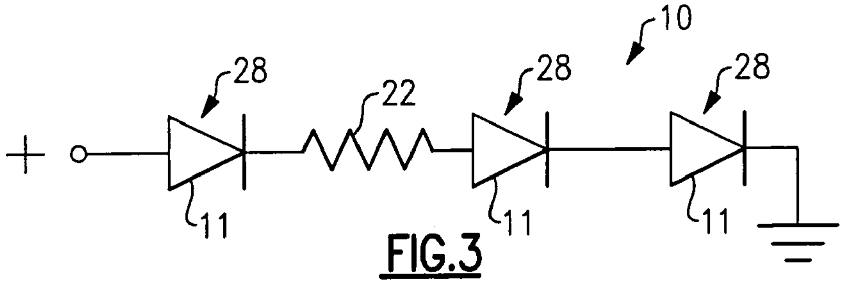
FIG. 3 illustrates an electrical diagram of the first exemplary embodiment of the present invention, FIG. 1.
Figure 4:
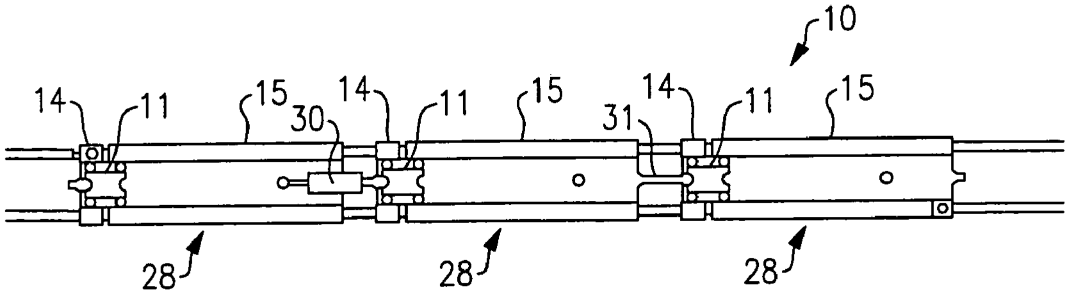
FIG. 4 illustrates a schematic diagram of a second exemplary embodiment of the present invention.

A second exemplary embodiment of the present invention 10, shown in FIG. 4, has a plurality of the light emitting modules 28 that may, if desired, be connected in series to generate greater illumination. In this particular case, the resistor 30 is connected in series with the light emitting modules 28. The resistor 30 may, if desired, be selected in the same manner as resistor 22 discussed above. The first light emitting module 28, shown in FIG. 3, has its anode connected to a positive power source. The cathode of the first light-emitting module 28 is connected to one end of the resistor 22 via a first substantially rectangular member 14. The other end of resistor 22 is connected to the anode of a second light-emitting module 28. The cathode of the second light emitting module 28 via a second substantially rectangular member 15 is connected to the anode of a third light emitting module 28. The cathode of the third light-emitting module 28 is connected to a negative or ground power source.

Figure 5:
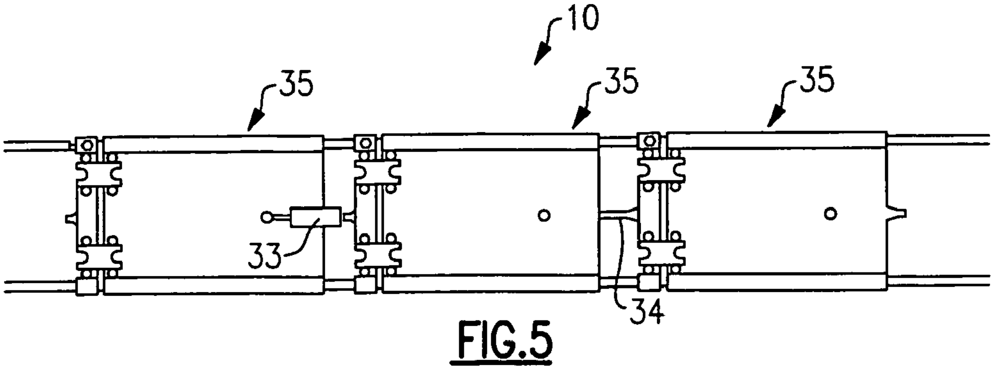
FIG. 5 illustrates a schematic diagram of a third exemplary embodiment of the present invention.

A third exemplary embodiment of the present invention 10, shown in FIG. 5, is interconnecting a plurality of light emitting modules 35 to form a matrix. Each light-emitting module 35 may, if desired, have two light emitters 11 electrically connected in parallel. The current limiting resistor 22 may, if desired, be electrically connected in series with any two light emitting modules 35. A subsequent or selected quantity of light emitting modules 35 may, if desired, be electrically ganged together via a connecting strap 34 to produce a desired or sufficient illumination.

Figure 6:
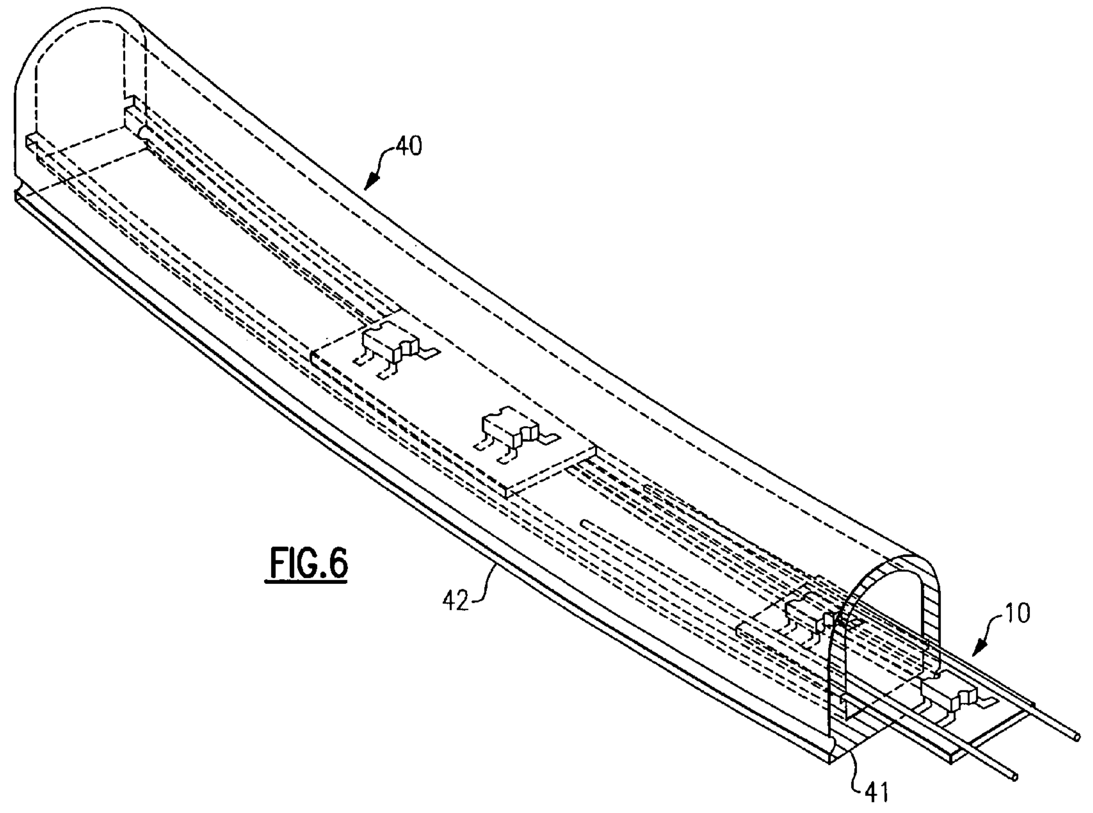
FIG. 6 illustrates a schematic diagram of an exemplary embodiment of the present invention encased in a semi-circular elongated tube.
Figure 7:
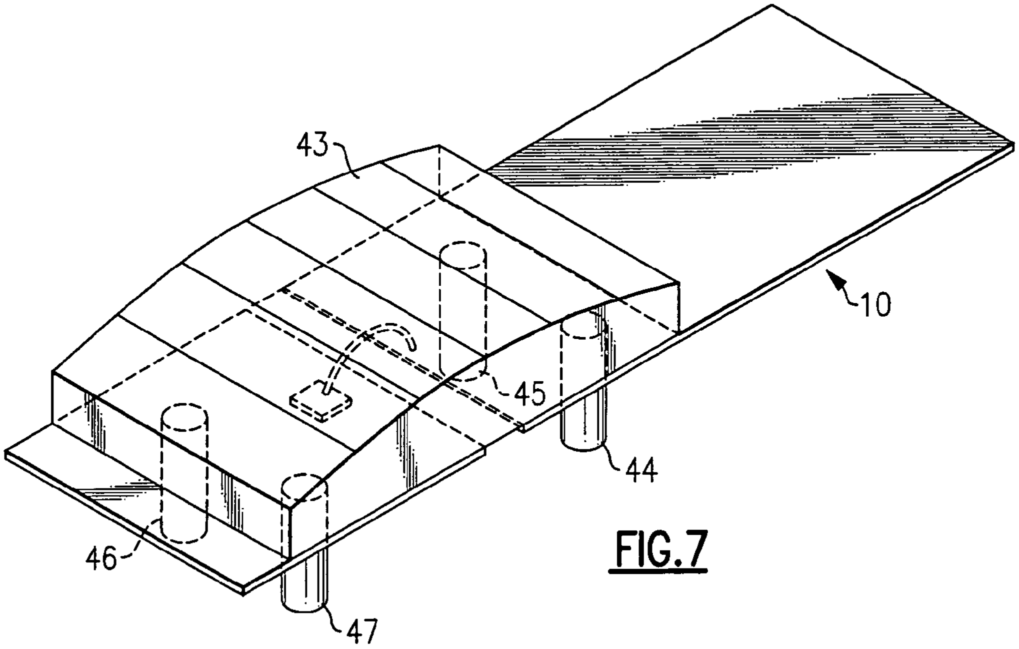
FIG. 7 illustrates a schematic diagram of an exemplary embodiment of the present invention with an arcuate cover disposed thereon.
Figure 8:
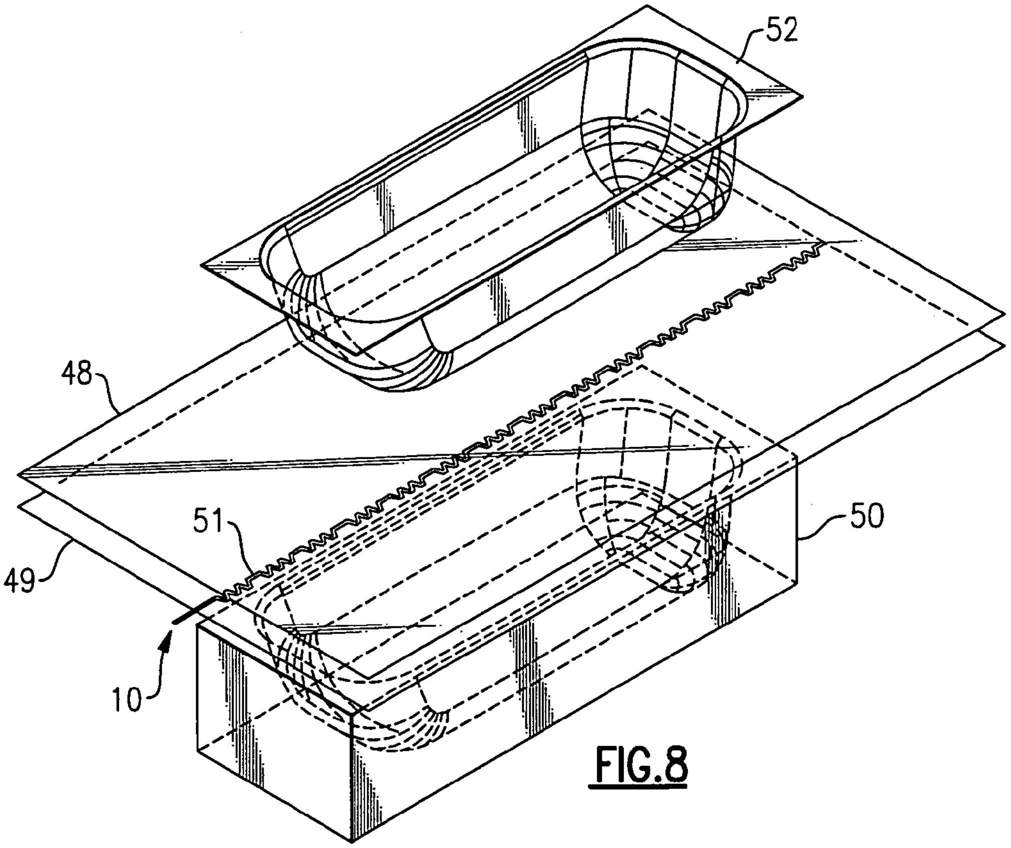
FIG. 8 illustrates a schematic diagram of an exemplary embodiment of the present invention embedded into a vacuum formable plane.

In application of the present invention 10, shown in FIG. 6, any convenient encasement or cover may be implemented to shroud the first and second heat-sinks. The encasement may if desired be translucent, opaque or any desirable color. For example, the present invention 10 is encased in a semi-circular elongated tube 40. The semi-circular elongated tube 40 has a flat bottom 41 that is hinge connected to the semi-circular portion of the elongated tube. The flat bottom 41, when open, enables the present invention 10 to be inserted into the confines of the semi-circular portion of the elongated tube 40 wherein the flat bottom 41 is detachably secured to the semi-circular portion of the elongated tube 40 by a snap mechanism 42. By way of another example, the present invention 10 has an arcuate cover 43 connected thereto via a plurality of cylindrical columns 44, 45, 46 and 47. In yet another example, the present invention 10 is embedded into an opaque plane 49 in a serpentine configuration 51. A translucent plane 48 is juxtaposition to the opaque plane 49 then both planes are juxtaposition a vacuum formable mold 50. The translucent plane 48 and the opaque plane 49 are vacuum formed to the shape of the mold 50 yielding a finished form 52 that has the serpentine configuration 51 now substantially aligned end to end due to the formation of the vacuum. The present invention 10 may, if desired, be configured as a plurality of serpentine configured strings embedded into the opaque plane 49.

Figure 9:
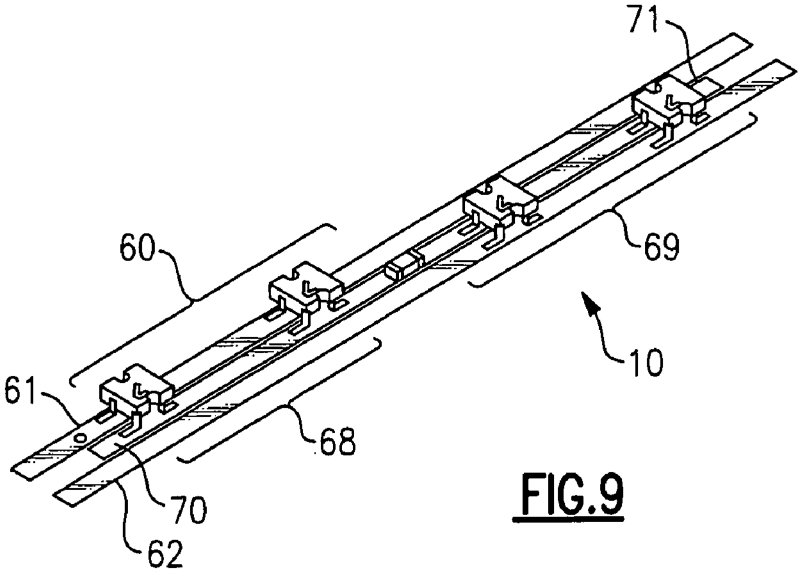
FIG. 9 illustrates a schematic diagram of a fourth exemplary embodiment of the present invention.
Figure 10:
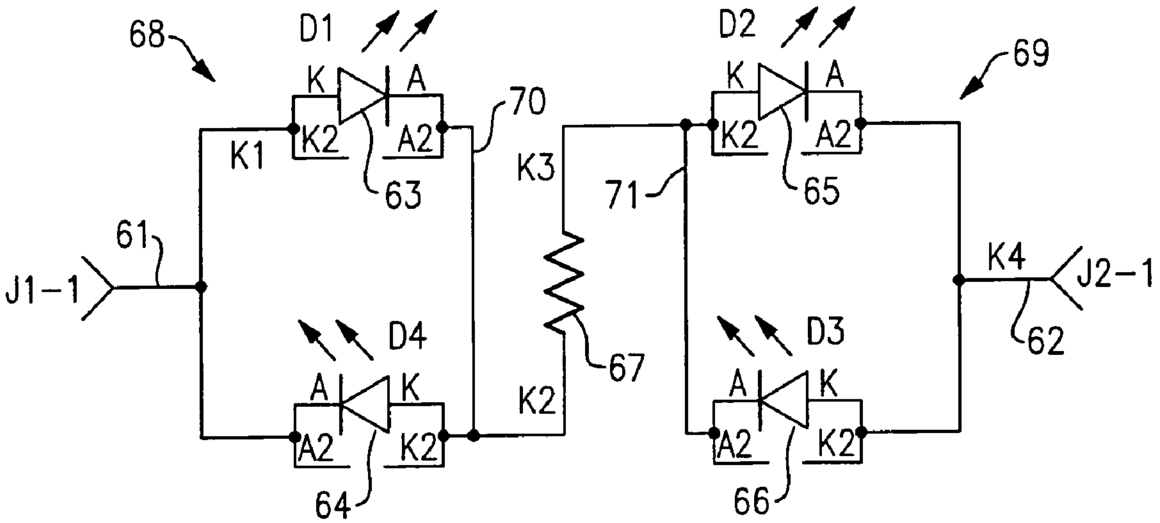
FIG. 10 illustrates an electrical diagram of the fourth exemplary embodiment of the present invention, FIG. 9.

A fourth exemplary embodiment of the present invention 10, shown in FIG. 9, is a light emitting module 60 structurally suspended between a pair of electrically isolated conductors 61 and 62 respectively. The light emitting module 60 may, if desired, be formed by a pair of light emitters 68 and 69 respectively. Each pair of light emitters 68 and 69 has a pair of light emitting diodes 63, 64 and 65, 66, respectively, as shown in FIG. 10. Each pair light emitting diodes 63, 64 and 65, 66 have their respective anodes electrically connected to the opposite respective cathodes. The light emitting diodes' 63, 64 anodes and cathodes respectively are connected to electrically isolated conductor 61 and their respective anodes and cathodes are connected at electrically isolated conductor 70, FIGS. 9 and 10. The light emitting diodes' 65, 66 anodes and cathodes are respectively are connected to electrically isolated conductor 62 and their respective anode and cathode connected at electrically isolated conductor 71, as shown in FIGS. 9 and 10. If desired, a selectable current limiting resistor 67 may be connected between the pair of light emitters 68 and 69 to control the current flow through each light emitter.

An electrically non-conductive tape may, if desired, be connected to the light emitting module 60 structurally suspended between the pair of electrically isolated conductors 61 and 62 to stabilize the electrically isolated conductors but is not required for operation of this embodiment of the present invention 10. The electrical conductors 61, 62, 70 and 71 may, if desired, be manufactured from a heat-sink type material that exhibits thermal characteristics to disperse heat away from the light emitting module 60. The electrical conductors 61, 62, 70 and 71 may, if desired, be manufactured from any convenient material or process. Examples of materials are copper, gold or silver. Examples of processes are cold rolled, stamped or punched pressed.

Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention as defined in the following claims, means-plus-function clause is intended to cover the structures described herein as performing the recited function and not only structural equivalents but also equivalent structures. Thus, by way of analogy, although a nail and a screw may not be structural equivalents in that a nail employs a cylindrical surface to secure wooden parts together whereas a screw employs a helical surface, in the environment of fastening wooden parts, a nail and a screw may be equivalent structures.

I claim:

1. A light emitting module being operationally disposed between two electrical conducting wires wherein each electrical conducting wire has selected insulated portions disposed thereabout, comprising:

a) a first heat-sink bounded by a perimeter, said first heat-sink adjacently spaced to a second heat-sink bounded by a perimeter, each said heat-sink having a facing perimeter edge;

b) said first heat-sink being connectively suspended between the selected insulated portions of the two electrical conducting wires;

c) means for electrically connecting said first heat-sink to the first electrical conducting wire;

d) said second heat-sink being connectively suspended between the selected insulated portions of the two electrical conducting wires;

e) means for electrically connecting said second heat-sink to the second electrical conducting wire; and f) a selected light emitter operationally connected between said first and said second heat-sinks.

2. The light-emitting module of claim 1, wherein said selected light emitter is a light emitting diode.

3. The light-emitting module of claim 1, wherein said selected light emitter comprises a plurality of light emitting diodes electrically connected in parallel.

4. The light-emitting module of claim 1, wherein said first heat-sink is electrically conductive.

5. The light-emitting module of claim 1, wherein said second heat-sink is electrically conductive.

6. The light-emitting module of claim 1, wherein said first heat-sink is thermally conductive.

7. The light-emitting module of claim 1, wherein said second heat-sink is thermally conductive.

8. The light-emitting module of claim 1, wherein the connectivity of said first and said second heat-sinks to their respective wires being selected from a group consisting of crimping, soldering, spot welding, bonding and alloying.

9. The light-emitting module of claim 1, wherein said means for electrically connecting said first heat-sink to the first electrical conducting wire comprises:

a) an outwardly projecting tab extending from the perimeter of said first heat-sink;

b) a selected resistor having one end connected to said outwardly projecting tab; and c) said selected resistor's other end being operationally disposed to the first electrical conducting wire.

10. The light-emitting module of claim 1, wherein said second heat-sink is fabricated from material having a thermal gradient sufficient to conduct heat away from the light emitter.

11. The light-emitting module of claim 10, wherein said second heat-sink's fabrication material is selected from a group consisting of copper, aluminum, gold and silver.

12. The light-emitting module of claim 1, further comprising:

g) a semi-circular elongated translucent tube, said semi-circular elongated translucent tube's rounded body portion being hinged to a flat bottom portion;

h) said flat bottom portion being detachably secured to said rounded body portion; and i) said semi-circular elongated translucent tube sized to receive said first and second heat-sinks insertable via said detachably secured flat bottom portion.

13. The light-emitting module of claim 1, further comprising:

g) an arcuate translucent cover having a bottom surface;

h) a plurality of cylindrical columns having one end of each column connected to said bottom surface; and i) said arcuate translucent cover juxtaposition said first and second heat-sinks, the other end of each said cylindrical column connectively engaging said first and second heat-sinks.

14. The light-emitting module of claim 1, further comprising:

g) a vacuum formable opaque plane being juxtaposition a vacuum mold, said vacuum formable opaque plane having embedded therein a plurality of said first and second heat-sinks connected in a serpentine configuration;

h) a vacuum formable translucent plane juxtaposition said vacuum formable opaque plane;

i) said vacuum formable translucent and opaque planes being formed to the shape of said vacuum mold;

whereby said serpentine configuration of said first and second heat-sinks elongated into a substantially aligned array via the forming of said first and second heat-sinks to the shape of said vacuum mold.

15. A light emitting module being operationally disposed between two electrical conducting wires wherein each electrical conducting wire has selected insulated portions disposed thereabout, comprising:

a) a first substantially rectangular member adjacently spaced to a second substantially rectangular member, each said member having a facing edge;

b) said first substantially rectangular member having one short side connectively disposed about the selected insulated portion of the first electrical conducting wire;

c) means for electrically connecting said first substantially rectangular member to the first electrical conducting wire;

d) said second substantially rectangular member having a selected portion of one long side connectively disposed about the second electrical conducting wire; and e) a selected light emitter operationally connected between said first and said second rectangular members.

16. The light-emitting module of claim 15, further comprising:

f) said first substantially rectangular member's other short side connectively disposed about the selected insulated portion of the second electrical conducting wire;

g) a selected portion of the other long side of said second rectangular member connectively disposed about the selected insulated portions of the first electrical conducting wire; and h) a selected portion of one long side of said second rectangular member connectively disposed about the selected insulated portion of the second electrical conducting wire.

17. The light-emitting module of claim 16, wherein said selected light emitter is a light emitting diode.

18. The light-emitting module of claim 16, wherein said selected light emitter comprises a plurality of light emitting diodes electrically connected in parallel.

19. The light-emitting module of claim 16, wherein said first substantially rectangular member is electrically conductive.

20. The light-emitting module of claim 16, wherein said second substantially rectangular member is electrically conductive.

21. The light-emitting module of claim 16, wherein said first substantially rectangular member is thermally conductive.

22. The light-emitting module of claim 16, wherein said second substantially rectangular member is thermally conductive.

23. The light-emitting module of claim 16, wherein the connectivity of said first and said second substantially rectangular members to their respective wires being selected from a group consisting of crimping, soldering, spot welding, bonding and alloying.

24. The light-emitting module of claim 16, wherein said means for connecting comprises:

a) an outwardly projecting tab disposed along one long side of said first substantially rectangular member;

b) a selected resistor having one end connected to said outwardly projecting tab; and c) said selected resistor's other end being operationally disposed to one of the electrical conducting wires.

25. The light-emitting module of claim 24, wherein said outwardly projecting tab is rectangularly shaped.

26. The light-emitting module of claim 16, wherein said second substantially rectangular member is fabricated from material having a thermal gradient sufficient to conduct heat away from the light emitter.

27. The light-emitting module of claim 26, wherein said second substantially rectangular member's fabrication material is selected from a group consisting of copper, aluminum, gold and silver.

28. A light emitting module being operationally disposed between two electrical conducting wires wherein each electrical conducting wire has selected insulated portions disposed thereabout, comprising:

a first substantially rectangular member adjacently spaced to a second substantially rectangular member, said first substantially rectangular member having one long side facing one of said second substantially rectangular member's short sides;

b) said first rectangular member having one short side connectively disposed about the selected insulated portion of the first electrical conducting wire;

c) said first rectangular member having the other short side connectively disposed about the selected insulated portion of the second electrical conducting wire;

d) a first substantially rectangular tab having one short side connected to the other long side of said first rectangular member;

e) a resistor with one end connected to said first substantially rectangular tab's other short side;

f) said resistor's other end is connected to the first electrical conducting wire;

g) said second rectangular member having a selected portion of one long side connectively disposed about the second electrical conducting wire;

h) said second rectangular member having a selected portion of the other long side connectively disposed about the selected insulated portion of the first electrical conducting wire;

i) said second rectangular member having a selected portion of one long side connectively disposed about the selected insulated portion of the second electrical conducting wire;

said first and said second rectangular members having a light emitter connectively suspended therebetween;

the light emitter having an anode and cathode;

l) said anode being connectively disposed to the said first substantially rectangular member;

m) said cathode being connectively disposed to the said second substantially rectangular member;

n) a second outwardly projecting tab having one end connected to the other short side of said second rectangular member; and o) said second outwardly projecting tab's other end outwardly extending for receiving subsequent light emitting modules.

* * * * *